United States Patent
Iwasaki et al.

(10) Patent No.: US 12,385,122 B2
(45) Date of Patent: Aug. 12, 2025

(54) YTTRIUM-FLUORIDE-BASED SPRAYED COATING, SPRAYED MEMBER, AND METHOD FOR PRODUCING YTTRIUM-FLUORIDE-BASED SPRAYED COATING

(71) Applicant: Shin-Etsu Chemical Co., Ltd., Tokyo (JP)

(72) Inventors: Ryo Iwasaki, Echizen (JP); Noriaki Hamaya, Echizen (JP); Yugo Taniguchi, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 498 days.

(21) Appl. No.: 17/779,682

(22) PCT Filed: Dec. 9, 2020

(86) PCT No.: PCT/JP2020/045770
§ 371 (c)(1),
(2) Date: May 25, 2022

(87) PCT Pub. No.: WO2021/124996
PCT Pub. Date: Jun. 24, 2021

(65) Prior Publication Data
US 2024/0026515 A1   Jan. 25, 2024

(30) Foreign Application Priority Data
Dec. 18, 2019   (JP) .................................. 2019-228286

(51) Int. Cl.
*C23C 4/04*   (2006.01)
*C01F 17/218*   (2020.01)
(Continued)

(52) U.S. Cl.
CPC .............. *C23C 4/04* (2013.01); *C01F 17/218* (2020.01); *C01F 17/259* (2020.01); *C23C 4/134* (2016.01);
(Continued)

(58) Field of Classification Search
None
See application file for complete search history.

(56) References Cited

U.S. PATENT DOCUMENTS

| | | | |
|---|---|---|---|
| 2004/0126614 | A1 | 7/2004 | Maeda et al. |
| 2017/0292182 | A1 | 10/2017 | Hamaya et al. |

(Continued)

FOREIGN PATENT DOCUMENTS

| | | |
|---|---|---|
| CN | 108069717 A | 5/2018 |
| JP | 2004-197181 A | 7/2004 |

(Continued)

OTHER PUBLICATIONS

International Search Report dated Feb. 16, 2021, issued in counterpart Application No. PCT/JP2020/045770, with English Translation. (7 pages).

(Continued)

*Primary Examiner* — David Sample
(74) *Attorney, Agent, or Firm* — WHDA, LLP

(57) ABSTRACT

According to the present invention, a yttrium-fluoride-based sprayed coating that has a Vickers hardness of 350 or higher, includes a $YF_3$ crystal phase having an orthorhombic crystal system, and does not include a $YF_3$ crystal phase having a crystal system other than an orthorhombic crystal system is produced by plasma-spraying a spray powder that includes a $YF_3$ crystal phase having an orthorhombic crystal system and does not include a $YF_3$ crystal phase having a crystal system other than an orthorhombic crystal system. In the present invention, it is possible to provide a yttrium-fluo- (Continued)

ride-based sprayed coating that has a high coating hardness and is such that the amount of particles generated upon exposure to a halogen-based gas plasma is low, and such a sprayed coating is exceptional as a sprayed coating formed on a member for a semiconductor-producing device that is used in a semiconductor production step.

18 Claims, 1 Drawing Sheet

(51) Int. Cl.
  *C01F 17/259* (2020.01)
  *C23C 4/134* (2016.01)
  *H01J 37/32* (2006.01)
(52) U.S. Cl.
  CPC .. *H01J 37/32449* (2013.01); *H01J 37/32495* (2013.01); *H01J 37/32825* (2013.01); *C01P 2002/30* (2013.01); *C01P 2002/60* (2013.01); *C01P 2002/72* (2013.01); *C01P 2004/61* (2013.01); *C01P 2006/20* (2013.01); *H01J 2237/332* (2013.01)

(56) References Cited

U.S. PATENT DOCUMENTS

2018/0127319 A1* 5/2018 Ashizawa .............. C04B 41/87
2019/0203330 A1   7/2019 Ibe et al.
2019/0326101 A1  10/2019 Ueda et al.

FOREIGN PATENT DOCUMENTS

| | | | |
|---|---|---|---|
| JP | 2017-190475 A | | 10/2017 |
| JP | 2018053356 A | * | 4/2018 |
| JP | 2019-192701 A | | 10/2019 |
| WO | 2018/052128 A1 | | 3/2018 |

OTHER PUBLICATIONS

Office Action dated Feb. 27, 2024, issued in counterpart CN application No. 202080088163.3. (7 pages).

* cited by examiner

YTTRIUM-FLUORIDE-BASED SPRAYED COATING, SPRAYED MEMBER, AND METHOD FOR PRODUCING YTTRIUM-FLUORIDE-BASED SPRAYED COATING

TECHNICAL FIELD

The present invention relates to an yttrium-fluoride-based sprayed coating suitable for use in a member for a semiconductor producing apparatus used in a semiconductor producing process, a method for producing the same, and a sprayed member.

BACKGROUND ART

In a plasma etching apparatus used in a semiconductor producing process, a wafer as an object to be treated is treated in a plasma atmosphere of a halogen-based gas that is a highly corrosive fluorine-based or chlorine-based gas. As the fluorine-based gas, $SF_6$, $CF_4$, $CHF_3$, $ClF_3$, HF, $NF_3$, or the like is used, and as the chlorine-based gas, $Cl_2$, $BCl_3$, HCl, $CCl_4$, $SiCl_4$, or the like is used.

In production of a member for a semiconductor producing apparatus exposed to the highly corrosive gas plasma atmosphere of a plasma etching apparatus, generally, a corrosion-resistant sprayed coating is formed on a surface of a substrate by atmospheric plasma spraying (APS) in which a raw material such as a rare earth compound is supplied in the form of powder, suspension plasma spraying (SPS) in which a raw material is sprayed in the form of slurry dispersed in a dispersion medium, or the like.

In recent years, with the progress of integration of semiconductors and the progress of miniaturization of wirings, particles falling off from a sprayed coating during plasma etching cause a decrease in yield in semiconductor producing. The wiring is becoming 10 nm or less, and further suppression of the amount of particle generation is required.

For example, JP-A 2017-190475 (Patent Document 1) describes a $YF_3$-containing yttrium-based fluoride sprayed coating that generates a smaller amount of particles. In addition, JP-A 2004-197181 (Patent Document 2) describes that an yttrium-fluoride-based sprayed coating is obtained by spraying using crystalline $YF_3$ as a raw material. Further, JP-A 2018-053356 (Patent Document 3) describes that an yttrium-fluoride-based sprayed coating including an orthorhombic $YF_3$ crystal phase and a YOF crystal phase is obtained by plasma-spraying a mixed material including orthorhombic $YF_3$ and YOF as a raw material.

On the other hand, JP-A 2019-192701 (Patent Document 4) describes that generation of foreign matters can be suppressed as the mean crystallite size of a coating is made to be smaller.

PRIOR ART DOCUMENTS

Patent Documents

Patent Document 1: JP-A 2017-190475
Patent Document 2: JP-A 2004-197181
Patent Document 3: JP-A 2018-053356
Patent Document 4: JP-A 2019-192701

SUMMARY OF INVENTION

Technical Problem

However, $YF_3$ observed in the yttrium-based fluoride sprayed coating described in Patent Document 1 is $YF_3$ with a crystal system other than an orthorhombic system (e.g., a hexagonal system, which is a high-temperature stable phase). A corrosion-resistant coating used for a member for a semiconductor producing apparatus will be exposed to a halogen-based gas plasma during plasma etching. If the corrosion-resistant coating includes a $YF_3$ crystal phase other than an orthorhombic $YF_3$ crystal phase, the plasma heat causes a phase transition of the $YF_3$ crystal phase from a high-temperature stable phase to a low-temperature stable phase of an orthorhombic crystal phase, and a volume change due to the phase transition of the coating effects occurring of a crack, which may result in generation of particles, and therefore, there is room for improvement.

In addition, in the atmospheric pressure spraying described in Patent Document 2, the $YF_3$ crystal phase other than an orthorhombic $YF_3$ crystal phase in the yttrium-fluoride-based sprayed coating cannot be completely eliminated, and in order to eliminate the $YF_3$ crystal phase other than an orthorhombic $YF_3$ crystal phase, heat treatment to the sprayed coating at 200 to 500° C. is required, which will increase the number of steps. Further, even if the sprayed coating is heat-treated, the hardness of the sprayed coating is not sufficiently high.

Furthermore, even in the plasma spraying described in Patent Document 3, the $YF_3$ crystal phase other than an orthorhombic $YF_3$ crystal phase in the yttrium-fluoride-based sprayed coating cannot be completely eliminated, and in order to eliminate the $YF_3$ crystal phase other than an orthorhombic $YF_3$ crystal phase, heat treatment to the sprayed coating at 200 to 500° C. is required, which will similarly increase the number of steps.

On the other hand, considering that the generation of foreign matters can be suppressed as the mean crystallite size of the coating is made to be smaller as described in Patent Document 4, in the coating in which the yttrium-fluoride-based sprayed coating obtained by plasma spraying described in Patent Document 2 or 3 is heat-treated to eliminate the $YF_3$ crystal phase other than an orthorhombic $YF_3$ crystal phase, crystallites of the coating disadvantageously grow by the heat treatment. That is, the yttrium-fluoride-based sprayed coating that is obtained through the step of the heat treatment and is free of $YF_3$ other than orthorhombic $YF_3$ has a large mean crystallite size and cannot suppress the generation of foreign matters, and therefore, there is room for improvement.

For an yttrium-based corrosion-resistant coating used for a member for a semiconductor producing apparatus, an yttrium oxide sprayed coating is being replaced by an yttrium-fluoride-based sprayed coating for suppressing generation of yttrium-based particles due to a reaction with a corrosive halogen-based gas plasma. However, even in the case of the yttrium-fluoride-based sprayed coating, the one with low coating hardness is vulnerable to plasma etching by a halogen-based gas plasma and is not sufficient for suppressing generation of particles. In addition, in a case where the yttrium-fluoride-based sprayed coating includes a $YF_3$ crystal phase, if a $YF_3$ crystal phase other than an orthorhombic $YF_3$ crystal phase (e.g., a hexagonal crystal phase, which is a high-temperature stable phase) exists, the $YF_3$ crystal phase other than an orthorhombic $YF_3$ crystal phase undergoes phase transition to an orthorhombic crystal phase, which is a low-temperature stable phase, due to plasma heat when the coating is exposed to a halogen-based gas plasma during plasma etching, and a volume change of the coating during the phase transition effects occurring of a crack, which adversely results in generation of particles.

The present invention has been made in view of the above circumstances, and an object of the present invention is to provide an yttrium-fluoride-based sprayed coating that is used as a highly corrosion-resistant and $YF_3$ crystal phase-containing yttrium-fluoride-based sprayed coating for a member for a semiconductor producing apparatus and that generates a smaller amount of particles when exposed to a halogen-based gas plasma, a sprayed member including such a sprayed coating, and a method capable of efficiently producing such a sprayed coating.

Solution to Problem

The present inventors have made intensive studies to solve the above problems and have thereby found that an yttrium-fluoride-based sprayed coating including an orthorhombic $YF_3$ crystal phase, being free of a $YF_3$ crystal phase other than an orthorhombic $YF_3$ crystal phase, and having a Vickers hardness of 350 or more remarkably suppresses generation of yttrium-based particles in a halogen-based gas plasma atmosphere, a sprayed member having such a sprayed coating formed on a substrate is excellent as a member for a semiconductor producing apparatus, such a sprayed coating can be formed by plasma-spraying a spray material, and an yttrium-fluoride-based sprayed coating having a high coating hardness can be produced without heat treatment to the sprayed coating, and have completed the present invention.

Thus, the present invention provides an yttrium-fluoride-based sprayed coating, a sprayed member, and a method for producing an yttrium-fluoride-based sprayed coating described below.

1. An yttrium-fluoride-based sprayed coating including an orthorhombic $YF_3$ crystal phase, being free of a $YF_3$ crystal phase other than an orthorhombic $YF_3$ crystal phase, and having a Vickers hardness of 350 or more.
2. The yttrium-fluoride-based sprayed coating according to 1, further including a crystal phase of yttrium oxyfluoride.
3. The yttrium-fluoride-based sprayed coating according to 2, wherein the yttrium oxyfluoride is one or more selected from $Y_5O_4F_7$, $Y_6O_5F_8$, $Y_7O_6F_9$, and YOF.
4. The yttrium-fluoride-based sprayed coating according to any of 1 to 3, being free of a $Y_2O_3$ crystal phase.
5. The yttrium-fluoride-based sprayed coating according to any of 1 to 4, having a thickness of 10 to 500 μm.
6. The yttrium-fluoride-based sprayed coating according to any of 1 to 5 formed on a substrate, wherein, based on an amount of yttrium quantified by
   immersing the yttrium-fluoride-based sprayed coating having a predetermined surface area in ultrapure water together with the substrate, performing ultrasonic cleaning at an output of 200 W for 30 minutes, taking out the yttrium-fluoride-based sprayed coating together with the substrate from the cleaning liquid for drying;
   subsequently, immersing the yttrium-fluoride-based sprayed coating in ultrapure water together with the substrate, performing ultrasonic treatment at an output of 200 W for 15 minutes, and taking out the yttrium-fluoride-based sprayed coating together with the substrate from the treatment liquid;
   subsequently, adding 2 ml of a 5.3 N nitric acid aqueous solution per 20 ml of the treatment liquid to the treatment liquid to dissolve yttrium-based particles dropped from the yttrium-fluoride-based sprayed coating in the treatment liquid; and
   quantifying the amount of yttrium contained in the treatment liquid by ICP emission spectrometry,
   a value corresponding to the mass of yttrium in the yttrium-based particles per the predetermined surface area is 1 μg/cm² or less.
7. A sprayed member including a substrate and the yttrium-fluoride-based sprayed coating according to any of 1 to 6 formed on the substrate.
8. The sprayed member according to 7, wherein the yttrium-fluoride-based sprayed coating is a single-layer structure coating.
9. The sprayed member according to 7 or 8, wherein the sprayed member is for a semiconductor producing apparatus.
10. A producing method for the yttrium-fluoride-based sprayed coating according to any of 1 to 6, the method including
    a step of plasma spraying of a spray powder including an orthorhombic $YF_3$ crystal phase and being free of a $YF_3$ crystal phase other than an orthorhombic $YF_3$ crystal phase.
11. The producing method according to 10, wherein the plasma spraying is atmospheric plasma spraying.
12. The producing method according to 11, wherein the spray distance in the step of the atmospheric plasma spraying is 50 to 90 mm.
13. The producing method according to any of 10 to 12, wherein the plasma spraying uses a mixed gas containing argon gas and hydrogen gas as a plasma gas.
14. The producing method according to 13, wherein the supply rate of the argon gas is 40 NLPM or more.
15. The producing method according to 13 or 14, wherein the supply rate of the hydrogen gas is 8 NLPM or more.
16. The producing method according to any of 10 to 15, wherein the spray powder has an oxygen content of 7 wt % or less.
17. The producing method according to any of 10 to 16, wherein the spray powder contains an yttrium-based crystal phase including only an orthorhombic $YF_3$ crystal phase or only an orthorhombic $YF_3$ crystal phase and a crystal phase of yttrium oxyfluoride, and the spray powder is a granulated and unbaked powder or a granulated and baked powder.
18. The producing method according to 17, wherein the yttrium oxyfluoride is one or more selected from $Y_5O_4F_7$, $Y_6O_5F_8$, and $Y_7O_6F_9$.
19. The producing method according to any of 10 to 16, wherein the spray powder contains an yttrium-based crystal phase including only an orthorhombic $YF_3$ crystal phase and a $Y_2O_3$ crystal phase, and the spray powder is a granulated and unbaked powder.
20. The producing method according to any of 10 to 19, being free of a step of heat-treating an yttrium-fluoride-based sprayed coating formed by plasma spraying.

Advantageous Effects of Invention

According to the present invention, it is possible to provide an yttrium-fluoride-based sprayed coating that has a high coating-hardness and generates a smaller amount of particles when exposed to a halogen-based gas plasma, and such a sprayed coating is excellent as a sprayed coating to be formed on a member for a semiconductor producing apparatus used in a semiconductor producing process. In addition, according to the present invention, such an yttrium-fluoride-based sprayed coating can be efficiently produced.

DESCRIPTION OF EMBODIMENTS

Figure 1:
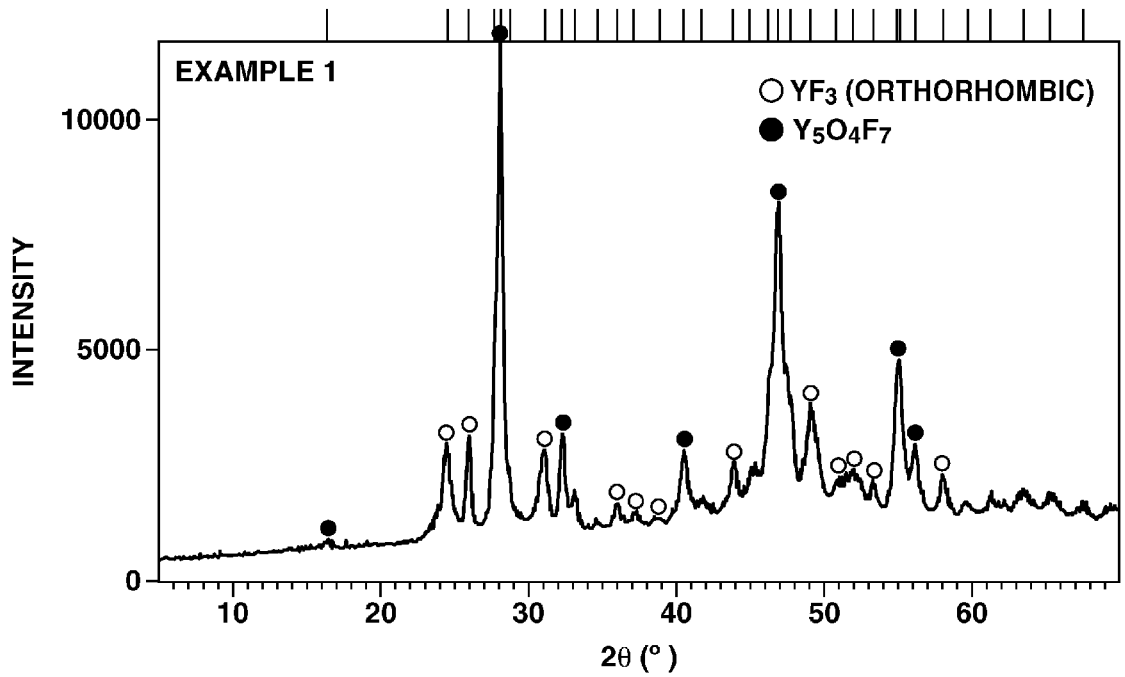
FIG. 1 is an X-ray diffraction profile of a sprayed coating obtained in Example 1.

Hereinafter, the present invention is described in more detail.

The sprayed coating of the present invention is an yttrium-fluoride-based sprayed coating including an orthorhombic (rhombic) $YF_3$ crystal phase and is suitable for use in a member for a semiconductor producing apparatus used in a semiconductor producing process. The yttrium-fluoride-based sprayed coating of the present invention is free of $YF_3$ crystal phase other than an orthorhombic $YF_3$ crystal phase (e.g., a hexagonal $YF_3$ crystal phase or the like, which is a high-temperature stable phase). The orthorhombic $YF_3$ crystal phase may be referred to as $\beta$-$YF_3$, and the hexagonal $YF_3$ crystal phase may be referred to as $\alpha$-$YF_3$.

Among diffraction peaks of crystal phases detected within the range of a diffraction angle $2\theta=10$ to $70°$ by an X-ray diffraction method (characteristic X-ray: Cu-K$\alpha$), diffraction peaks attributed to an orthorhombic $YF_3$ crystal phase are not particularly limited, but includes, for example, a diffraction peak attributed to the (101) plane of the crystal lattice, and this diffraction peak is usually detected around $2\theta=24.5°$. In addition, diffraction peaks of a $YF_3$ crystal phase other than an orthorhombic $YF_3$ crystal phase are not particularly limited, but diffraction peaks attributed to a hexagonal $YF_3$ crystal phase include, for example, a diffraction peak attributed to the (111) plane of the crystal lattice and this diffraction peak is usually detected around $2\Theta=29.3°$.

In the sprayed coating of the present invention, the mean crystallite size determined from the half width of a diffraction peak attributed to the orthorhombic $YF_3$ crystal phase is preferably 70 nm or less, more preferably 60 nm or less, still more preferably 50 nm or less, and particularly preferably 40 nm or less. The mean crystallite size of 70 nm or less allows reduction of a change in the crystallite size after the coating surface is plasma-etched by a halogen-based gas plasma and allows reduction of generation of yttrium-based particles. On the other hand, the mean crystallite size is not particularly limited, but is usually 5 nm or more.

Since the yttrium-fluoride-based sprayed coating of the present invention is particularly free of a hexagonal $YF_3$ crystal phase, which is a high-temperature stable phase, there is no volume change of the coating resulting from the phase transition from a hexagonal $YF_3$ crystal phase to an orthorhombic $YF_3$ phase caused by plasma heat in plasma etching using a corrosive halogen-based gas used in a semiconductor producing process or the like, and the volume change of the coating as a whole is suppressed, so that generation of yttrium-based particles under a halogen-based gas plasma atmosphere is small.

The yttrium-fluoride-based sprayed coating of the present invention has a Vickers hardness of 350 or more, preferably 400 or more, more preferably 450 or more, and still more preferably 480 or more. The Vickers hardness of 350 or more allows the coating surface to be hardly plasma-etched by a halogen-based gas plasma and the corrosion resistance to be further enhanced. On the other hand, the Vickers hardness is preferably higher, but is usually 1,000 or less. The Vickers hardness of 1,000 or less allows the coating to be hardly peeled off from a substrate. Note that the Vickers hardness can be measured according to JIS Z 2244.

The yttrium-fluoride-based sprayed coating contains yttrium (Y) and fluorine (F) as essential constituent elements, but may contain another element such as oxygen (O). In addition, a small amount of a rare earth (lanthanoid) element may be contained in addition to yttrium (Y), but the metal element contained in the yttrium-fluoride-based sprayed coating is preferably only yttrium (Y). Note that the yttrium-fluoride-based sprayed coating is allowed to contain an element in an impurity amount.

The yttrium-fluoride-based sprayed coating of the present invention may include an yttrium oxyfluoride crystal phase. The sprayed coating including an yttrium oxyfluoride crystal phase is advantageous in that the amount of yttrium-based particles generated when the sprayed coating is exposed to a corrosive halogen-based gas plasma is even smaller. The yttrium oxyfluoride constituting the yttrium oxyfluoride crystal phase is preferably one or more selected from $Y_5O_4F_7$, $Y_6O_5F_8$, $Y_7O_6F_9$, and YOF ($Y_1O_1F_1$), and particularly when including YOF, the yttrium oxyfluoride is preferably YOF and one or more selected from $Y_5O_4F_7$, $Y_6O_5F_8$, and $Y_7O_6F_9$. On the other hand, the yttrium-fluoride-based sprayed coating of the present invention is preferably free of a $Y_2O_3$ crystal phase.

The yttrium-fluoride-based sprayed coating of the present invention preferably has a thickness of 10 μm or more from the viewpoint of durability against corrosion by a halogen-based gas plasma. The thickness is more preferably 30 μm or more, and still more preferably 50 μm or more. On the other hand, the thickness of the sprayed coating is preferably 500 μm or less. The coating thickness of 500 μm or less allows the coating to be hardly peeled off from a substrate. The thickness is more preferably 400 μm or less, and still more preferably 300 μm or less.

In the yttrium-fluoride-based sprayed coating of the present invention, the surface roughness (surface asperity) Ra is preferably 8 μm or less, more preferably 7 μm or less, and still more preferably 6 μm or less from the viewpoint of further suppressing generation of particles by a halogen-based gas plasma. In addition, the surface roughness (surface asperity) Ra is not particularly limited, but is usually 0.1 μm or more from the same viewpoint.

In the yttrium-fluoride-based sprayed coating of the present invention, yttrium-based particles are hardly generated when the sprayed coating is exposed to a halogen-based gas plasma, and generation of particles immediately after production of the yttrium-fluoride-based sprayed coating is also very small. In the yttrium-fluoride-based sprayed coating of the present invention, when the generation of particles is evaluated as a value corresponding to the mass of yttrium in the yttrium-based particles per predetermined surface area of the sprayed coating (the surface area of the sprayed coating subjected to the evaluation) by a method of, for example, in a state where the sprayed coating is formed on a substrate, (1) immersing the sprayed coating having the predetermined surface area in ultrapure water together with the substrate, performing ultrasonic cleaning at an output of 200 W for 30 minutes, taking out the sprayed coating together with the substrate from the cleaning liquid for drying;

(2) immersing the sprayed coating in ultrapure water together with the substrate, performing ultrasonic treatment at an output of 200 W for 15 minutes, and taking out the sprayed coating together with the substrate from the treatment liquid;

(3) adding 2 ml of a 5.3 N nitric acid aqueous solution per 20 ml of the treatment liquid to the treatment liquid to dissolve yttrium-based particles dropped from the sprayed coating in the treatment liquid; and (4) quantifying the amount of yttrium contained in the treatment liquid by ICP emission spectrometry, the above value is preferably 1 µg/cm$^2$ or less. If the above value exceeds 1 µg/cm$^2$, generation of the particles may be too large to withstand use in a plasma etching apparatus. The amount of Y particles is more preferably 0.8 µg/cm$^2$ or less, and still more preferably 0.6 µg/cm$^2$ or less.

By forming the yttrium-fluoride-based sprayed coating of the present invention on a substrate, a sprayed member including the substrate and the yttrium-fluoride-based sprayed coating, in particular, a sprayed member in which the yttrium-fluoride-based sprayed coating is directly formed on the substrate can be provided, and such a sprayed member is preferably applied as a sprayed member for a semiconductor producing apparatus. In the present invention, the yttrium-fluoride-based sprayed coating may be a single-layer structure coating or a multilayer structure coating, but is preferably a single-layer structure coating.

The material of the substrate is not particularly limited, but includes metals such as stainless steel, aluminum, nickel, chromium, zinc, and alloys thereof; inorganic compounds (ceramics) such as alumina, zirconia, aluminum nitride, silicon nitride, silicon carbide, and quartz glass; carbon; and the like, and a suitable material is selected according to the application (e.g., an application such as for a semiconductor producing apparatus) of the sprayed member. For example, an acid-resistant substrate to which alumite treatment was applied is preferable for a substrate of aluminum metal or aluminum alloy. The shape of the substrate is also not particularly limited, and examples thereof include a flat plate shape and a cylindrical shape.

For production of the yttrium-fluoride-based sprayed coating of the present invention, a method of plasma-spraying a spray powder (spray particles) as a spray material is suitably applied. In the present invention, it is possible to produce an yttrium-fluoride-based sprayed coating including an orthorhombic YF$_3$ crystal phase and being free of a YF$_3$ crystal phase other than an orthorhombic YF$_3$ crystal phase as a highly corrosion-resistant yttrium-fluoride-based sprayed coating that is an yttrium-fluoride-based sprayed coating including a YF$_3$ crystal phase, generates a smaller amount of yttrium-based particles when exposed to a halogen-based gas plasma, and has a high hardness such that a Vickers hardness is 350 or more.

The plasma spraying includes atmospheric plasma spraying (APS), suspension plasma spraying (SPS), and the like, but in consideration of cost reduction and mass production, atmospheric plasma spraying is preferable. When atmospheric plasma spraying is applied as the plasma spraying, the spray distance is preferably 90 mm or less, more preferably 85 mm or less, and still more preferably 80 mm or less. As the spray distance decreases, the deposit efficiency of the sprayed coating improves, the hardness increases, and the porosity decreases. On the other hand, the spray distance is not particularly limited, but is preferably 50 mm or more, more preferably 55 mm or more, and still more preferably 60 mm or more. Note that the spray distance is a distance from the nozzle of a spray gun to the target on which the sprayed coating is to be formed.

A plasma gas used for forming a plasma in the plasma spraying includes a single gas or a mixed gas of two or more selected from argon gas (Ar), hydrogen gas (H$_2$), helium gas (He), and nitrogen gas (N$_2$). The plasma gas is preferably a mixed gas containing argon gas and hydrogen gas, but is not particularly limited. The mixed gas containing argon gas and hydrogen gas may contain another gas such as hydrogen gas or helium gas.

When argon gas is used as the plasma gas, the supply rate of argon gas is not particularly limited, but is preferably 40 NLPM (Normal Liter Per Minute) or more, and more preferably 42 NLPM or more. As the supply rate of argon gas is higher, the speed of the spray particles is higher, which is advantageous in that the adhesion strength of the sprayed coating to be formed is improved. On the other hand, the supply rate of argon gas is preferably higher, but is usually 100 NLPM or less. The supply rate of argon gas of 100 NLPM or less can lighten the load on a spraying device, which is also advantageous in terms of costs.

When hydrogen gas is used as the plasma gas, the supply rate of hydrogen gas is not particularly limited, but is preferably 8 NLPM or more, and more preferably 10 NLPM or more. As the supply rate of hydrogen gas is higher, the amount of heat applied to the spray particles is larger, which is advantageous in that the hardness of the sprayed coating to be formed is improved. On the other hand, the supply rate of hydrogen gas is preferably higher, but is usually 20 NLPM or less. The supply rate of hydrogen gas of 20 NLPM or less can lighten the load on a spraying device, which is also advantageous in terms of costs.

An applied power in the plasma spraying is not particularly limited, but is preferably 35 kW or more, and more preferably 40 kW or more. On the other hand, the applied power is not particularly limited, but is preferably 85 kW or less, and more preferably 60 kW or less. The current value is not particularly limited, but is preferably 600 A or more, and more preferably 620 A or more. As the value of the current value is higher, the speed and temperature of the spray particles are higher, which is advantageous in that the hardness and adhesion strength of the coating to be formed are improved. On the other hand, the current value is preferably higher, but is usually 1,000 A or less. The current value of 1,000 A or less can lighten the load on a spraying device.

The temperature of the substrate during spraying is preferably 100° C. or higher, more preferably 130° C. or higher, and still more preferably 150° C. or higher. As the temperature is higher, the bond between the substrate and the sprayed coating to be formed is stronger, and the sprayed coating can be made dense. In addition, as the temperature becomes higher, a rapid-cooling stress is generated, and the hardness of the sprayed coating to be formed is improved.

On the other hand, the temperature of the substrate or the substrate and sprayed coating formed on the substrate during spraying is preferably 300° C. or lower, more preferably 270° C. or lower, and still more preferably 250° C. or lower. As the temperature is lower, damage and deformation of the substrate due to heat can be prevented. In addition, as the temperature is lower, generation of thermal stress can be suppressed, and peeling between the substrate and the sprayed coating formed can be prevented. Note that the temperature can be achieved by controlling the cooling capacity.

Other spray conditions such as a supply rate of a spray powder in plasma spraying are not particularly limited, and conventionally known conditions can be applied and may be appropriately set according to the use of the substrate, the spray material, the obtained sprayed member, and the like.

A spray powder used in production of the yttrium-fluoride-based sprayed coating of the present invention is preferably a spray powder including an orthorhombic YF$_3$ crystal phase and being free of a YF$_3$ crystal phase other than an orthorhombic $YF_3$ crystal phase. The spray powder contains yttrium (Y) and fluorine (F) as essential constituent elements but may contain another element such as oxygen (O). In addition, a small amount of a rare earth (lanthanoid) element may be contained in addition to yttrium (Y), but the metal element contained in the spray powder is preferably only yttrium (Y). Note that the spray powder is allowed to contain an element in an impurity amount.

The oxygen content of the spray powder is preferably 7 wt % or less. The oxygen content of 7 wt % or less allows easy production of the yttrium-fluoride-based sprayed coating including an orthorhombic $YF_3$ crystal phase and being free of a $YF_3$ crystal phase other than an orthorhombic $YF_3$ crystal phase even by plasma spraying in an air atmosphere. The oxygen content is more preferably 6.5 wt % or less. On the other hand, the oxygen content is not particularly limited, but is 0 wt % when the spray powder is free of oxygen, and is more than 0 wt %, preferably 1 wt % or more, and more preferably 2 wt % or more when the spray powder contains oxygen.

In production of the yttrium-fluoride-based sprayed coating of the present invention, it is preferable to use a spray powder including an yttrium-based crystal phase including only an orthorhombic $YF_3$ crystal phase, or only an orthorhombic $YF_3$ crystal phase and an yttrium oxyfluoride crystal phase. Here, yttrium oxyfluoride constituting the yttrium oxyfluoride crystal phase is preferably one or more selected from $Y_5O_4F_7$, $Y_6O_5F_8$, and $Y_7O_6F_9$. In addition, it is also preferable to use a spray powder including an yttrium-based crystal phase including only an orthorhombic $YF_3$ crystal phase and a $Y_2O_3$ crystal phase. Here, the $Y_2O_3$ crystal phase is not particularly limited, but is preferably a cubic crystal phase.

The spray powder is preferably a granulated and unbaked powder or a granulated and baked powder. Here, the granulated and unbaked powder means a powder obtained as a spray powder by granulating a powder which is then not baked, and the granulated and baked powder means a powder obtained as a spray powder by granulating a powder which is then baked.

The particle size of the spray powder (spray particles) is not particularly limited, but the mean particle size D50 is preferably 80 μm or less, more preferably 60 μm or less, and still more preferably 50 μm or less. In the present invention, the mean particle size D50 is the cumulative 50% size (median size) in a volume-based particle size distribution. As the particle size of the spray particles decreases, the size of a splat to be formed by molten particles colliding with a substrate during spraying decreases, and the sprayed coating to be formed can be made dense. On the other hand, the mean particle size D50 is preferably 10 μm or more, more preferably 15 μm or more, and still more preferably 18 μm or more. As the particle size of the spray particles increases, molten particles have a larger momentum and collide with a substrate or the coating formed on the substrate to form a splat easily.

In a method for producing the yttrium-fluoride-based sprayed coating of the present invention, a step of heat treatment (note that this heat treatment includes annealing treatment carried out for eliminating residual stress and the like) of the yttrium-fluoride-based sprayed coating formed by plasma spraying is not essential, and it is possible to obtain a good yttrium-fluoride-based sprayed coating that is an yttrium-fluoride-based sprayed coating including an orthorhombic $YF_3$ crystal phase and being free of a $YF_3$ crystal phase other than an orthorhombic $YF_3$ crystal phase and that has high coating hardness, without heat treatment.

When the sprayed coating is formed on a substrate, it is preferable to increase the surface roughness (surface asperity) Ra by roughening treatment, for example, acetone-decreasing the surface of the substrate on which the sprayed coating is to be formed, and performing roughening treatment using an abrasive material such as corundum. By roughening treatment of the substrate, it is possible to effectively suppress peeling of the coating resulting from a difference in thermal expansion coefficient between the sprayed coating and the substrate after spraying application. The degree of the roughening treatment may be appropriately adjusted according to the material or the like of the substrate.

In particular, when the sprayed coating is directly formed on a substrate, the surface roughness (surface asperity) Ra of the surface of the substrate on which the sprayed coating is to be formed is made to be high as described above, and plasma spraying is performed with the temperature of the substrate set to the temperature as described above, so that it is possible to form a sprayed coating that is more hardly peeled off, has higher hardness, and is denser. In such a case, since the surface roughness (surface asperity) Ra of the formed sprayed coating tends to increase, the surface roughness (surface asperity) Ra is made to be lowered by surface processing such as mechanical polishing (surface grinding, inner cylinder processing, mirror finishing, etc.), blasting using fine beads or the like, or hand polishing using a diamond pad, so that it is possible to form a smooth sprayed coating that is more hardly peeled off, has higher hardness, is dense, and has low surface roughness (surface asperity) Ra.

EXAMPLES

Hereinafter, the present invention is specifically described illustrating Examples and Comparative Examples, but the present invention is not limited to the following Examples.

Example 1

The surface of a 20 mm square (thickness: 5 mm) A 5052 aluminum alloy substrate was acetone-degreased, and one surface of the substrate was roughening-treated using a corundum abrasive. Atmospheric plasma spraying was performed to the substrate with the substrate temperature set to 170° C. using a granulated and baked powder that has a mean particle size D50 of 30 μm, an oxygen content of 2.3 wt %, and a crystal phase including an orthorhombic $YF_3$ crystal phase and a $Y_5O_4F_7$ crystal phase, and thus obtaining an yttrium-fluoride-based sprayed coating (sprayed member) having a thickness of 200 μm.

For the sprayed coating obtained, the crystal phase was identified by X-ray diffraction (XRD), and the crystal configuration was analyzed. In addition, the thickness, the surface roughness Ra, the Vickers hardness, and the mean crystallite size were measured. Further, the corrosion resistance of the sprayed coating and the amount of generation of yttrium-based particles were evaluated using the sprayed coating obtained. The results are shown in Table 1. Note that details of each measurement, analysis, and evaluation are described below. In addition, the XRD profile is shown in FIG. 1.

The atmospheric plasma spraying was carried out under an air atmosphere at normal pressure using a spray machine F4 available from Oerlikon Metco AG. The sprayed coating was formed by adjusting the spray distance to 80 mm, the argon gas flow rate to 42 NLPM, the hydrogen gas flow rate to 12 NLPM, and the applied power to 44 kW. The spraying conditions of the atmospheric plasma spraying under which the sprayed coating was formed are shown in Table 2.

Example 2

An yttrium-fluoride-based sprayed coating (sprayed member) having a thickness of 200 μm was obtained in the same manner as in Example 1 except for using a granulated and unbaked powder that has a mean particle size D50 of 35 μm, an oxygen content of 2.7 wt %, and a crystal phase including an orthorhombic $YF_3$ crystal phase and a cubic $Y_2O_3$ crystal phase. The sprayed coating obtained was subjected to the same measurement, analysis, and evaluation as in Example 1. The results are shown in Table 1. In addition, the spraying conditions of the atmospheric plasma spraying under which the sprayed coating was formed are shown in Table 2.

Example 3

An yttrium-fluoride-based sprayed coating (sprayed member) having a thickness of 100 μm was obtained in the same manner as in Example 1 except for using a granulated and baked powder that has a mean particle size D50 of 30 μm, an oxygen content of 6.3 wt %, and a crystal phase including an orthorhombic $YF_3$ crystal phase and a $Y_5O_4F_7$ crystal phase. The sprayed coating obtained was subjected to the same measurement, analysis, and evaluation as in Example 1. The results are shown in Table 1. In addition, the spraying conditions of the atmospheric plasma spraying under which the sprayed coating was formed are shown in Table 2.

Comparative Example 1

Figure 2:
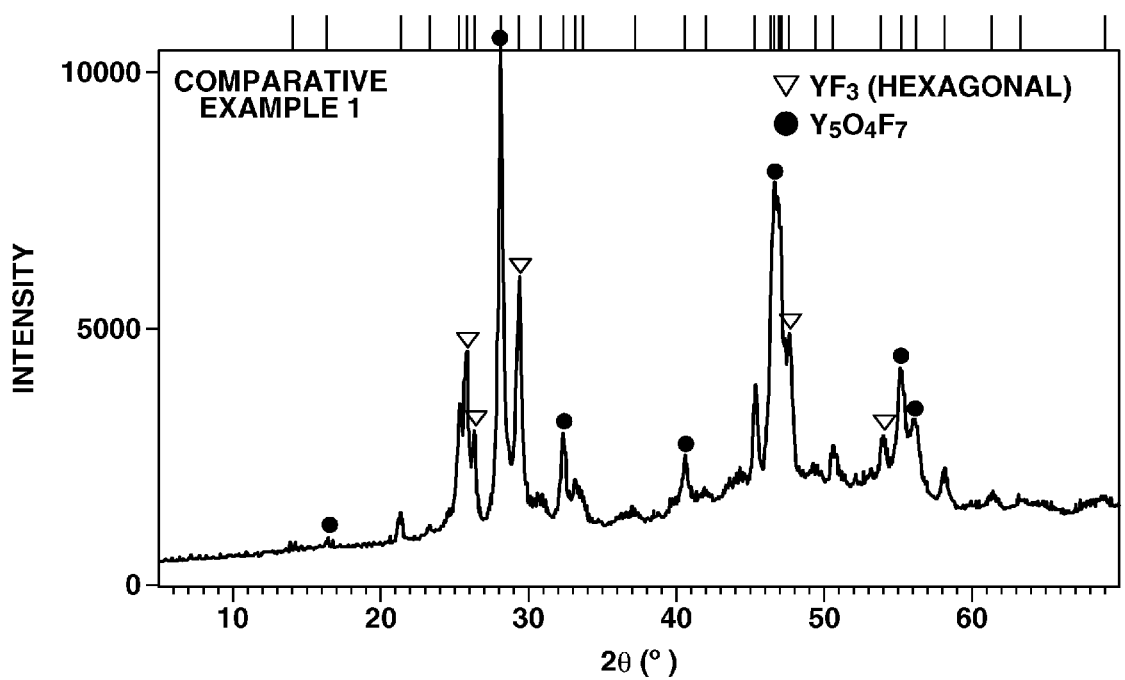
FIG. 2 is an X-ray diffraction profile of a sprayed coating obtained in Comparative Example 1.

The surface of a 20 mm square (thickness: 5 mm) A 5052 aluminum alloy substrate was acetone-degreased, and one surface of the substrate was roughening-treated using a corundum abrasive. The atmospheric plasma spraying was performed to the substrate with the substrate temperature set to 90° C. using the same granulated and baked powder as the raw material used in Example 1, thus obtaining an yttrium-fluoride-based sprayed coating (sprayed member) having a thickness of 200 μm. The sprayed coating obtained was subjected to the same measurement, analysis, and evaluation as in Example 1. The results are shown in Table 1. In addition, the XRD profile is shown in FIG. 2.

The atmospheric plasma spraying was carried out under an air atmosphere at normal pressure using a spray machine F4 available from Oerlikon Metco AG. The sprayed coating was formed by adjusting the spray distance to 120 mm, the argon gas flow rate to 40 NLPM, the hydrogen gas flow rate to 6 NLPM, and the applied power to 36 kW. The spraying conditions of the atmospheric plasma spraying under which the sprayed coating was formed are shown in Table 2.

Comparative Example 2

An yttrium-fluoride-based sprayed coating (sprayed member) having a thickness of 200 μm was obtained in the same manner as in Comparative Example 1 except for using the same granulated powder as the raw material used in Example 2. The sprayed coating obtained was subjected to the same measurement, analysis, and evaluation as in Example 1. The results are shown in Table 1. In addition, the spraying conditions of the atmospheric plasma spraying under which the sprayed coating was formed are shown in Table 2.

Comparative Example 3

An yttrium-fluoride-based sprayed coating (sprayed member) having a thickness of 70 μm was obtained in the same manner as in Comparative Example 1 except for using a granulated and baked powder having a mean particle size D50 of 30 μm, an oxygen content of 9.2 wt %, and a crystal phase including a $Y_5O_4F_7$ crystal phase. The sprayed coating obtained was subjected to the same measurement, analysis, and evaluation as in Example 1. The results are shown in Table 1. In addition, the spraying conditions of the atmospheric plasma spraying under which the sprayed coating was formed are shown in Table 2.

Comparative Example 4

An yttrium-fluoride-based sprayed coating (sprayed member) having a thickness of 40 μm was obtained in the same manner as in Comparative Example 1 except for using a granulated and baked powder having a mean particle size D50 of 30 μm, an oxygen content of 12.8 wt %, and a crystal phase including a YOF crystal phase. The sprayed coating obtained was subjected to the same measurement, analysis, and evaluation as in Example 1. The results are shown in Table 1. In addition, the spraying conditions of the atmospheric plasma spraying under which the sprayed coating was formed are shown in Table 2.

TABLE 1

| | Example | | | Comparative Example | | | |
|---|---|---|---|---|---|---|---|
| | 1 | 2 | 3 | 1 | 2 | 3 | 4 |
| | XRD crystal phase | | | | | | |
| | $Y_5O_4F_7$ β-$YF_3$ | $Y_5O_4F_7$ β-$YF_3$ | $Y_5O_4F_7$ YOF β-$YF_3$ | $Y_5O_4F_7$ α-$YF_3$ | $Y_5O_4F_7$ α-$YF_3$ | $Y_7O_6F_9$ YOF $Y_2O_3$ | YOF $Y_2O_3$ |
| Thickness (μm) | 200 | 200 | 100 | 200 | 200 | 70 | 40 |
| Surface roughness Ra (μm) | 4.4 | 4.3 | 4 | 3.9 | 3.7 | 5.7 | 4.6 |
| Vickers hardness | 510 | 560 | 410 | 370 | 390 | 100 | 150 |
| Mean crystallite size (nm) | 28 | 23 | 35 | 45 | 42 | — | — |
| Corrosion resistance (mean level difference μm) | 3 | 2.8 | 3.3 | 3.5 | 3.6 | 5.1 | 4.8 |
| Y particles (μg/cm$^2$) | 0.1 | 0.3 | 0.4 | 1.1 | 1.3 | 89 | 120.5 |

(β-$YF_3$: orthorhombic,
α-$YF_3$: hexagonal)

TABLE 2

|  | Example | | | Comparative Example | | | |
| --- | --- | --- | --- | --- | --- | --- | --- |
| Spray method | 1 APS | 2 APS | 3 APS | 1 APS | 2 APS | 3 APS | 4 APS |
| Ar (NLPM) | 42 | 42 | 42 | 40 | 40 | 40 | 40 |
| H$_2$ (NLPM) | 12 | 12 | 12 | 6 | 6 | 6 | 6 |
| Spray material supply rate (g/min) | 20 | 20 | 20 | 20 | 20 | 20 | 20 |
| Current (A) | 620 | 620 | 620 | 600 | 600 | 600 | 600 |
| Voltage (V) | 72 | 72 | 72 | 61 | 61 | 61 | 61 |
| Power (kW) | 44 | 44 | 44 | 36 | 36 | 36 | 36 |
| Spray distance (mm) | 80 | 80 | 80 | 120 | 120 | 120 | 120 |

[X-ray Diffraction (XRD)]

Measurement was performed using an X-ray diffractometer X'Pert PRO/MPD manufactured by Malvern Panalytical Limited, and the crystal phase was identified using analysis software HighScore Plus manufactured by Malvern Panalytical Limited. The measurement conditions were as follows: characteristic X-ray: Cu-Kα (tube voltage: 45 kV, tube current: 40 mA), scanning range: 2θ=5 to 70°, step size: 0.0167113°, time per step: 13.970 seconds, and scanning speed: 0.151921°/sec.

[Thickness]

Measurement was performed using an eddy-current thickness meter LH-300J manufactured by Kett Electric Laboratory Co. Ltd.

[Surface Roughness (Surface Asperity) Ra]

Measurement was performed using a surface asperity measuring instrument HANDYSURF E-35A manufactured by Tokyo Seimitsu Co., Ltd.

[Vickers Hardness]

The surface of a coating test piece was processed to obtain a mirrored surface (surface roughness Ra=0.1 μm), and measurement was performed on the mirror finished surface of the test piece using a micro Vickers hardness tester HMV-G manufactured by Shimadzu Corporation, with a load set to 300 gf (2.942 N) and a holding time set to 10 seconds, and evaluation was performed as a mean value of 5 points.

[Mean Crystallite Size]

An X-ray profile was obtained by measuring 2θ from 10° to 100° with the incident angle fixed to 1.5° by an X-ray diffraction method. For an X-ray profile obtained, diffraction peaks were indexed. The half values of width of diffraction peaks were determined for diffraction peaks attributed to the (101) plane, the (020) plane, and the (210) plane of the orthorhombic YF$_3$ crystal phase for Examples 1 to 3, and for diffraction peaks attributed to the (002) plane, the (110) plane, and the (111) plane of the hexagonal YF$_3$ crystal phase for Comparative Examples 1 and 2, and the mean crystallite sizes were calculated by a Williamson-Hall method.

[Test for Evaluating Corrosion Resistance]

A surface of the sprayed coating (surface layer coating) of a sprayed member test piece was mirror-finished (Ra=0.1 μm), a portion covered with masking tape and a coating exposed portion were formed, and then the test piece was set in a reactive ion plasma tester and exposed to a plasma under the conditions as follows: plasma output: 440 W, gas type: CF$_4$+O$_2$ (20 vol %), flow rate: 20 sccm, gas pressure: 5 Pa, and time: 8 hours. For the test piece exposed to the plasma, the height of a level difference generated by corrosion between the portion covered with the masking tape and the coating exposed portion was measured using a stylus type surface profile measuring instrument Dektak 3030 manufactured by Bruker Nano, Inc., and the mean value of the four measurement points was determined to evaluate the corrosion resistance. In the evaluation by the above test, the mean value of the heights of the level differences (mean level difference) is preferably 4.0 μm or less. If the mean level difference exceeds 4.0 μm, sufficient plasma etching resistant ability may not be exhibited when the sprayed coating is used in a plasma etching apparatus. The mean level difference is more preferably 3.5 μm or less, and still more preferably 3.3 μm or less.

[Test for Evaluating Amount of Generation of Y Particles]

A sprayed member test piece on which a sprayed coating having a surface area of 20 mm square (4 cm$^2$) had been formed was ultrasonically cleaned (output: 200 W, cleaning time: 30 minutes) in a state where the test piece was immersed in ultrapure water with the sprayed coating side facing the water surface, and contamination removal after spraying was performed. Subsequently, the test piece was dried and then ultrasonically treated (output: 200 W, cleaning time: 15 minutes) in a state where the test piece was immersed in 20 ml of ultrapure water contained in a 100 ml polyethylene bottle with the sprayed coating side facing the bottom of the polyethylene bottle. After the ultrasonic treatment, the test piece was taken out, and 2 ml of a 5.3 N nitric acid aqueous solution was added to the treatment liquid after the ultrasonic treatment to dissolve yttrium-based particles contained in the treatment liquid. The amount of Y contained in the treatment liquid was measured by ICP emission spectrometry and evaluated as a Y mass per surface area (4 cm$^2$) of the sprayed coating of the test piece.

It is found that, in the yttrium-fluoride-based sprayed coatings of Examples 1 to 3 including an orthorhombic YF$_3$ crystal phase and being free of a YF$_3$ crystal phase other than an orthorhombic YF$_3$ crystal phase, the amounts of generation of yttrium-based particles in the test for evaluating the amount of generation of Y particles are much smaller than those of the sprayed coatings of Comparative Examples 1 to 4. In addition, it is found that, in the yttrium-fluoride-based sprayed coatings of Examples 1 to 3, the mean level differences after the plasma etching in the test for evaluating corrosion resistance are smaller than those in Comparative Examples 1 to 4. Therefore, it is found that the yttrium-fluoride-based sprayed coating of the present invention is an excellent sprayed coating suitable for use in a member for a semiconductor producing apparatus.

The invention claimed is:

1. An yttrium-fluoride-based sprayed coating comprising an orthorhombic YF$_3$ crystal phase and a crystal phase of Y$_5$O$_4$F$_7$, being free of a YF$_3$ crystal phase other than an orthorhombic YF$_3$ crystal phase, and having a mean crystallite size of 5 nm to 70 nm that is determined from half widths of diffraction peaks attributed to (101), (020), and (210) planes of the orthorhombic YF$_3$ crystal phase by a Williamson-Hall method, and a Vickers hardness of 350 or more.

2. The yttrium-fluoride-based sprayed coating according to claim 1, being free of a Y$_2$O$_3$ crystal phase.

3. The yttrium-fluoride-based sprayed coating according to claim 1, having a thickness of 10 to 500 μm.

4. The yttrium-fluoride-based sprayed coating according to claim 1 formed on a substrate, wherein, based on an amount of yttrium quantified by immersing the yttrium-fluoride-based sprayed coating having a predetermined surface area in ultrapure water together with the substrate, performing ultrasonic cleaning at an output of 200 W for 30 minutes, taking out the yttrium-fluoride-based sprayed coating together with the substrate from a cleaning liquid for drying;

subsequently, immersing the yttrium-fluoride-based sprayed coating in ultrapure water together with the substrate, performing ultrasonic treatment at an output of 200 W for 15 minutes, and taking out the yttrium-fluoride-based sprayed coating together with the substrate from a treatment liquid;

subsequently, adding 2 ml of a 5.3 N nitric acid aqueous solution per 20 ml of the treatment liquid to the treatment liquid to dissolve yttrium-based particles dropped from the yttrium-fluoride-based sprayed coating in the treatment liquid; and quantifying the amount of yttrium contained in the treatment liquid by ICP emission spectrometry, a value corresponding to a mass of yttrium in the yttrium-based particles per the predetermined surface area is 1 $\mu g/cm^2$ or less.

5. A sprayed member comprising a substrate and the yttrium-fluoride-based sprayed coating according to claim 1 formed on the substrate.

6. The sprayed member according to claim 5, wherein the yttrium-fluoride-based sprayed coating is a single-layer structure coating.

7. The sprayed member according to claim 5, wherein the sprayed member is for a semiconductor producing apparatus.

8. A producing method for the yttrium-fluoride-based sprayed coating according to claim 1, the method comprising a step of plasma spraying of a spray powder including an orthorhombic $YF_3$ crystal phase and being free of a $YF_3$ crystal phase other than an orthorhombic $YF_3$ crystal phase.

9. The producing method according to claim 8, wherein the plasma spraying is atmospheric plasma spraying.

10. The producing method according to claim 9, wherein a spray distance in the step of the atmospheric plasma spraying is 50 to 90 mm.

11. The producing method according to claim 8, wherein the plasma spraying uses a mixed gas containing argon gas and hydrogen gas as a plasma gas.

12. The producing method according to claim 11, wherein a supply rate of the argon gas is 40 NLPM or more.

13. The producing method according to claim 11, wherein a supply rate of the hydrogen gas is 8 NLPM or more.

14. The producing method according to claim 8, wherein the spray powder has an oxygen content of 7 wt % or less.

15. The producing method according to claim 8, wherein the spray powder contains an yttrium-based crystal phase including only an orthorhombic $YF_3$ crystal phase or only an orthorhombic $YF_3$ crystal phase and a crystal phase of yttrium oxyfluoride, and the spray powder is a granulated and unbaked powder or a granulated and baked powder.

16. The producing method according to claim 15, wherein the yttrium oxyfluoride is one or more selected from $Y_5O_4F_7$, $Y_6O_5F_8$, and $Y_7O_6F_9$.

17. The producing method according to claim 8, wherein the spray powder contains an yttrium-based crystal phase including only an orthorhombic $YF_3$ crystal phase and a $Y_2O_3$ crystal phase, and the spray powder is a granulated and unbaked powder.

18. The producing method according to claim 8, being free of a step of heat-treating an yttrium-fluoride-based sprayed coating formed by plasma spraying.

* * * * *